(12) United States Patent
Nemoto et al.

(10) Patent No.: US 9,543,191 B2
(45) Date of Patent: Jan. 10, 2017

(54) WIRING STRUCTURE HAVING INTERLAYER INSULATING FILM AND WIRING LINE WITHOUT A BARRIER LAYER BETWEEN

(71) Applicants: TOKYO ELECTRON LIMITED, Tokyo (JP); ZEON CORPORATION, Tokyo (JP); TOHOKU UNIVERSITY, Miyagi (JP)

(72) Inventors: Takenao Nemoto, Miyagi (JP); Takehisa Saito, Miyagi (JP); Yugo Tomita, Miyagi (JP); Hirokazu Matsumoto, Tokyo (JP); Akihide Shirotori, Tokyo (JP); Akinobu Teramoto, Miyagi (JP); Xun Gu, Miyagi (JP)

(73) Assignees: ZEON CORPORATION, Tokyo (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 14/380,306

(22) PCT Filed: Feb. 21, 2013

(86) PCT No.: PCT/JP2013/054380
§ 371 (c)(1),
(2) Date: Aug. 21, 2014

(87) PCT Pub. No.: WO2013/125647
PCT Pub. Date: Aug. 29, 2013

(65) Prior Publication Data
US 2015/0041983 A1 Feb. 12, 2015

(30) Foreign Application Priority Data
Feb. 22, 2012 (JP) .................................. 2012-036424

(51) Int. Cl.
*H01L 23/48* (2006.01)
*H01L 21/00* (2006.01)
(Continued)

(52) U.S. Cl.
CPC ....... *H01L 21/768* (2013.01); *H01J 37/32192* (2013.01); *H01L 21/0212* (2013.01);
(Continued)

(58) Field of Classification Search
CPC .................. H01L 23/53238; H01L 23/53295; H01L 21/02063; H01L 21/76801; H01L 21/76826; H01L 21/768; H01L 21/0212; H01L 21/02274; H01L 23/53204; H01L 21/3205; H01L 21/76814; H01L 21/76831; H01L 21/31058
(Continued)

(56) References Cited

U.S. PATENT DOCUMENTS

| | | | | |
|---|---|---|---|---|
| 6,165,898 A | * | 12/2000 | Jang et al. | ..................... 438/638 |
| 2002/0160604 A1 | * | 10/2002 | Quek et al. | ................... 438/689 |

(Continued)

FOREIGN PATENT DOCUMENTS

| | | |
|---|---|---|
| JP | 11-16918 A | 1/1999 |
| JP | 2005-64302 A | 3/2005 |

(Continued)

OTHER PUBLICATIONS

Miyata et al. (J. Vac. Sci. Technol. A 14(4) p. 2083-2087, Aug. 1996).*

(Continued)

*Primary Examiner* — Dzung Tran
(74) *Attorney, Agent, or Firm* — Rothwell, Figg, Ernst & Manbeck, P.C.

(57) ABSTRACT

Provided are a semiconductor device and semiconductor-device manufacturing method that make it possible to
(Continued)

improve the contact between an insulating film and a wiring member and the reliability thereof. This method for manufacturing a semiconductor device (100) includes a step in which a CF film (106) is formed on top of a semiconductor substrate (102), a step in which grooves (C) corresponding to a wiring pattern (P) are formed in the CF film (106), and a step in which a copper wiring member (114) is embedded in the grooves (C).

3 Claims, 11 Drawing Sheets

(51) Int. Cl.
```
H01L 21/44       (2006.01)
H01L 21/31       (2006.01)
H01L 21/768      (2006.01)
H01L 23/532      (2006.01)
H01L 21/02       (2006.01)
H01J 37/32       (2006.01)
H01L 21/3105     (2006.01)
H01L 21/3205     (2006.01)
H01L 21/311      (2006.01)
```
(52) U.S. Cl.
CPC .. *H01L 21/02063* (2013.01); *H01L 21/02274* (2013.01); *H01L 21/31058* (2013.01); *H01L 21/3205* (2013.01); *H01L 21/76801* (2013.01); *H01L 21/76814* (2013.01); *H01L 21/76826* (2013.01); *H01L 21/76828* (2013.01); *H01L 21/76831* (2013.01); *H01L 23/53204* (2013.01); *H01L 23/53238* (2013.01); *H01L 23/53295* (2013.01); *H01L 21/02126* (2013.01); *H01L 21/02167* (2013.01); *H01L 21/31138* (2013.01); *H01L 21/31144* (2013.01); *H01L 2924/0002* (2013.01)

(58) Field of Classification Search
USPC ......... 257/753, E21.499; 438/463, 644, 689, 438/654, 612
See application file for complete search history.

(56) References Cited

U.S. PATENT DOCUMENTS

| | | | |
|---|---|---|---|
| 2008/0254641 A1* | 10/2008 | Kobayashi et al. | 438/763 |
| 2009/0108413 A1* | 4/2009 | Ohmi | 257/632 |
| 2009/0283901 A1* | 11/2009 | Ohmi | 257/700 |
| 2010/0025856 A1* | 2/2010 | Kawamura et al. | 257/773 |

FOREIGN PATENT DOCUMENTS

| | | | |
|---|---|---|---|
| JP | 2006-128591 A | 5/2006 | |
| JP | 2008-294040 A | 12/2008 | |
| JP | 2011-14933 A | 1/2011 | |

OTHER PUBLICATIONS

International Search Report mailed May 28, 2013 in PCT/JP2013/054380.

M. Tada, et al., "Barrier-metal-free (BMF), Cu Dual-damascene Interconnects with Cu-epi-contacts buried in Anti-diffusive, Low-k Organic film," 2001 Symposium on VLSI Technology Digest of Technical Papers; 4-89114-013-5 2001 IEEE (2 pages).

Marianna Pantouvaki et al., "Advanced Organic Polymer for the Aggressive Scaling of Low-k Materials," Japanese Journal of Applied Physics 50 (2011) 04DB01 (5 pages).

\* cited by examiner

WIRING STRUCTURE HAVING INTERLAYER INSULATING FILM AND WIRING LINE WITHOUT A BARRIER LAYER BETWEEN

CROSS REFERENCE TO RELATED APPLICATION

This application is a 35 U.S.C. 371 National Phase Entry Application from PCT/JP2013/054380, filed Feb. 21, 2013, which claims priority to Japanese Patent Application No. 2012-036424, filed Feb. 22, 2012, the disclosures of which are incorporated herein in their entirety by reference.

TECHNICAL FIELD

The present disclosure relates to a semiconductor device manufacturing method and a semiconductor device.

BACKGROUND ART

A wiring structure formed by a damascene process technique has conventionally been known. For example, in a conventional multilayer wiring structure, a barrier layer (barrier metal) is formed between an interlayer insulating film and Cu (copper) which is a material of a wiring line) to prevent Cu from being diffused into the insulating film. With this wiring structure, since the barrier layer having a predetermined thickness is provided between the insulating film and Cu, wiring may be inevitably delayed due to increased resistance (contact resistance). With regard to this problem, the following Non-Patent Documents 1 and 2 disclose a wiring structure in which no barrier layer is provided between the insulating film and Cu.

PRIOR ART DOCUMENT

Non-Patent Document

Non-Patent Document 1: M. Tada, et al., "*Barrier-metal-free (BMF), Cu Dual-damascene Interconnects with Cu-epi-contacts Buried in Anti-Diffusive, Low-k Organic Film*", 2001 VLSI Technology, 2001; Digest of Technical Papers; 2001 Symposium at IEEE, 12-14 Jun. 2001, pp. 13-14

Non-Patent Document 2: Marianna Pantouvaki et al., "*Advanced Organic Polymer for the Aggressive Scaling of Low-k Materials*", Japanese Journal of Applied Physics, 2011, Volume 50, Issue 4, pp. 04DB01-04DB01-5

DISCLOSURE OF THE INVENTION

Problems to be Solved

Recently, miniaturization and higher speed of a semiconductor device have been demanded and lowering of permittivity (low-k) of an insulating film has been demanded in order to achieve the miniaturization and higher speed of the semiconductor device. In connection with this, in the structure disclosed in Non-Patent Document 1, an organic film of divinyl-siloxane-bis-benzocyclobutene (k=2.6) is adopted as an insulating film but lower permittivity is demanded in consideration of the wiring delay. Further, in this insulating film, due to its characteristic, when an annealing processing is performed at a high temperature of 250° C. or higher, Cu may be separated from the insulating film.

Further, in the structure disclosed in Non-Patent Document 2, Cu is diffused into the insulating film at any case so that time-dependent dielectric breakdown (TDDB) is unavoidable. Therefore, it is difficult to obtain a semiconductor device having high reliability in the structure disclosed in Non-Patent Document 2.

The present disclosure has been made in an effort to solve the above described problems and an object of the present disclosure is to provide a method of manufacturing a semiconductor device and the semiconductor device which may improve adhesion between the insulating film and a wiring member and reliability.

Means to Solve the Problems

A method of manufacturing a semiconductor device according to an aspect of the present disclosure is a method of manufacturing a semiconductor device in which a wiring line is formed on an insulating film using a damascene method. The semiconductor device manufacturing method includes: forming a fluorinated carbon film as the insulating film, forming a groove corresponding to the wiring line in the insulating film, and filling copper, which is a wiring member, in the groove.

In the semiconductor device manufacturing method, the groove is formed in the insulating film formed of fluorinated carbon, and copper, (hereinafter, referred to as "Cu") which is a wiring member, is filled in the groove and buried. As described above, according to the semiconductor device manufacturing method, fluorinated carbon is used as the insulating film so that even when Cu is directly buried without providing a barrier metal layer between the insulating film and Cu, Cu may be prevented from being diffused into the insulating film. Therefore, according to the semiconductor device manufacturing method, TDDB is suppressed from occurring and reliability of the semiconductor device may be improved. Further, according to the semiconductor device manufacturing method, fluorinated carbon is coupled to Cu, so that Cu may be suppressed from being separated from the insulating film even when the annealing processing is performed at a high temperature. As a result, in the semiconductor device manufacturing method, adhesion between the insulating film and Cu may be improved.

In an exemplary embodiment, the semiconductor device manufacturing method may further include: processing the insulating film formed with the groove by plasma to modify a front surface of the insulating film. As described above, according to the semiconductor device manufacturing method, the plasma processing is performed on the front surface of the insulation film so that the front surface is modified, which may result in improved adhesion between the insulating film which is a fluorinated carbon film and Cu.

In an exemplary embodiment, when the front surface of the insulating film is modified, a fluorine content on the front surface is changed. According to the semiconductor device manufacturing method, for example, the fluorine content on the front surface of the insulating film is reduced by the modification so that a carbon-rich layer (a layer in which a carbon content is higher than the fluorine content) is formed on the front surface of the insulating film. Therefore, according to the semiconductor device manufacturing method, coupling between the fluorinated carbon and Cu may be improved. As a result, according to the semiconductor device manufacturing method, adhesion between the insulating film which is the fluorinated carbon film and Cu may be further increased.

In an exemplary embodiment, the front surface of the insulating film is modified by plasma processing which includes nitrogen as an active species. As described above, according to the semiconductor device manufacturing method, the insulating film is processed by a nitride plasma processing so that the surface of the insulating film may be satisfactorily modified.

In an exemplary embodiment, a processing time of the plasma processing is 4 seconds to 60 seconds.

In an exemplary embodiment, the semiconductor device manufacturing method may further include forming an oxide film inside the groove and Cu may be filled in the groove after the oxide film is formed in the groove. Therefore, according to the semiconductor device manufacturing method, a semiconductor device may be obtained in which a wiring resistance may be reduced.

In an exemplary embodiment, a film forming device is used in the forming of the fluorinated carbon film. The film forming device includes a processing container which forms a processing space, a microwave generator, an antenna configured to radiate a microwave generated by the microwave generator, a dielectric window provided between the processing space and the antenna, a gas supply unit configured to supply a gas for exciting plasma, and a material gas supply unit configured to supply a material gas for forming the fluorinated carbon film. Then, the gas for exciting plasma is supplied from the gas supply unit, the microwave is radiated from the antenna to excite the plasma, the material gas is supplied from the material gas supply unit, and the material gas is reacted with the plasma to form the fluorinated carbon film. According to the semiconductor device manufacturing method, when the fluorinated carbon film is formed as described above, a fluorinated carbon film which is dense and has high adhesion with Cu and high thermal stability may be obtained.

A semiconductor device according to another aspect of the present disclosure is a semiconductor device in which a wiring line is formed on an insulating film by a damascene method and includes the insulating film which is a fluorinated carbon film and a wiring member formed of copper which is provided on the insulating film and buried in a groove corresponding to the wiring line.

In this semiconductor device, copper (hereinafter, referred to as Cu) which is a wiring member is buried in the groove of the insulating film which is formed of fluorinated carbon. As described above, according to the semiconductor device, fluorinated carbon is used as the insulating film so that even when Cu is directly buried without providing a barrier metal layer between the insulating film and Cu, the fluorinated carbon film has an excellent Cu barrier function, thereby suppressing Cu from being diffused into the insulating film. Therefore, according to the semiconductor device, TDDB may be suppressed from occurring and reliability of the semiconductor device may be improved. Further, according to the semiconductor device, fluorinated carbon is coupled to Cu, so that Cu may be suppressed from being separated from the insulating film even when the annealing processing is performed at a high temperature. As a result, according to the semiconductor device, adhesion between the insulating film and Cu may be improved.

In an exemplary embodiment, a front surface (a surface on which Cu is formed) of the insulating film which is in contact with Cu is modified by the plasma processing. With this configuration, according to the semiconductor device, higher adhesion between Cu and the insulating film may be obtained.

In the exemplary embodiment, the front surface of the insulating film is modified so that a fluorine content is changed. With this configuration, according to the semiconductor device, for example, the front surface of the insulating film is modified so as to reduce the fluorine content so that adhesion between the insulating film which is a fluorinated carbon film (a film in which a front surface on which Cu is formed is a carbon-rich layer) and Cu may be further increased.

In an exemplary embodiment, the front surface of the insulating film is modified by plasma processing which includes nitrogen as an active species.

Effect of the Invention

According to an aspect of the present disclosure, adhesion between the insulating film and the wiring member and reliability may be improved.

BRIEF DESCRIPTION OF THE DRAWINGS

FIG. 5 is a view

DETAILED DESCRIPTION TO EXECUTE THE INVENTION

Hereinafter, several exemplary embodiments will be described in detail with reference to the drawings. Further, in the drawings, the same or similar parts may be denoted by the same reference numerals.

Figure 1:
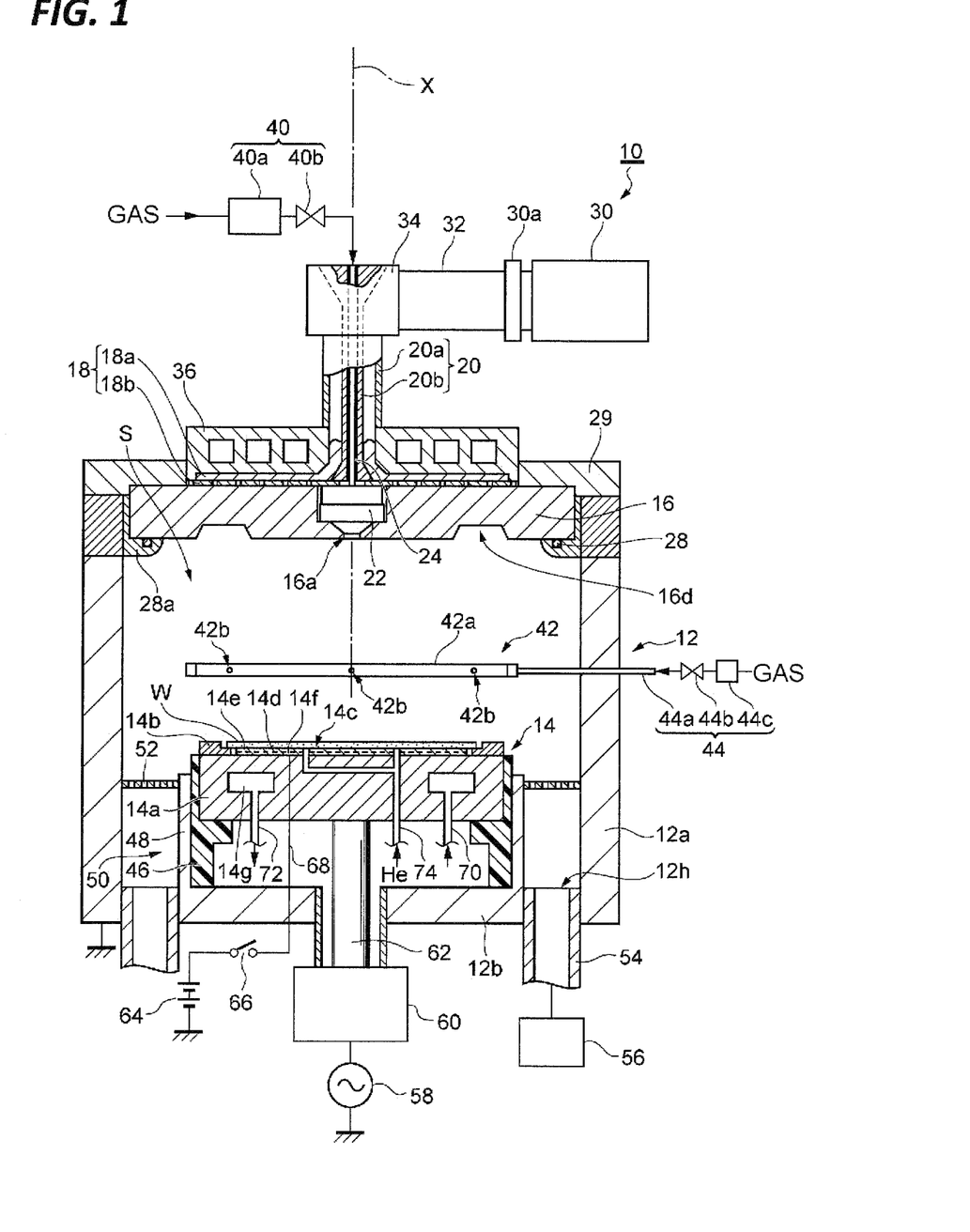
FIG. 1 is a view illustrating a plasma processing apparatus which is used to manufacture a semiconductor device according to an exemplary embodiment.

First, a plasma processing apparatus which is used for one process in a method of manufacturing a semiconductor device according to an exemplary embodiment will be described. FIG. 1 is a cross-sectional view schematically illustrating a plasma processing apparatus according to an exemplary embodiment.

A plasma processing apparatus 10 illustrated in FIG. 1 includes a processing container 12, a stage 14, a dielectric window member 16, an antenna 18, a coaxial waveguide 20, an injector 22, and a piping member 24.

The processing container 12 forms a processing space S in which the plasma processing is performed on a substrate to be processed W. The processing container 12 may include a side wall 12a and a bottom portion 12b. The side wall 12a has a substantially tubular shape which extends in an axis X direction. The bottom portion 12b is provided at a lower end of the side wall 12a. An exhaust hole 12h for exhaustion is formed in the bottom portion 12b. An upper end of the side wall 12a is open.

The upper end opening of the side wall 12a is hermetically closed by a support 28a to be capable of being opened/closed. The support 28a supports the dielectric window member 16 which is also referred to as a dielectric window. An O ring 28 is interposed between the dielectric window member 16 and the upper end of the side wall 12a and a sealed state of the processing container 12 is maintained.

The plasma processing apparatus 10 may further include a microwave generator 30. The microwave generator 30 generates a microwave having, for example, a frequency of 2.45 GHz. The microwave generator 30 includes a tuner 30a. The microwave generator 30 is connected to an upper portion of the coaxial waveguide 20 through a waveguide 32 and a mode converter 34.

The other end of the coaxial waveguide 20 extends below the dielectric window member 16 along the axis X to be connected to the top of the processing container 12. The coaxial waveguide 20 includes an outer conductor 20a and an inner conductor 20b. The outer conductor 20a has a tubular shape extending in the axis X direction. A planar antenna 18b is disposed on the top of the dielectric window member 16. A slow wave plate 18a is disposed so as to cover the planar antenna 18b and a cooling jacket 36 is disposed so as to cover the slow wave plate 18a. A lower end of the inner conductor 20b is connected to the planar antenna 18b which is a metallic slot plate. Outer peripheries of the dielectric window member 16, the planar antenna 18b, the slow wave plate 18a, and the cooling jacket 36 are supported by a pressing ring member 29. The planar antenna 18b is grounded through the pressing ring member 29 and the support 28a.

The slow wave plate 18a has a substantially disk shape. The slow wave plate 18a may be formed of a dielectric substance such as, for example, quartz or alumina. The slow wave plate 18a is sandwiched between the planar antenna 18b and a bottom surface of the cooling jacket 36. Accordingly, the antenna 18 may be configured by the slow wave plate 18a, the planar antenna 18b, and the bottom surface of the cooling jacket 36. The cooling jacket 36 cools down the planar antenna 18b, the slow wave plate 18a, and the pressing ring member 29 to prevent the deformation and damage thereof due to the heat of the plasma.

Figure 2:
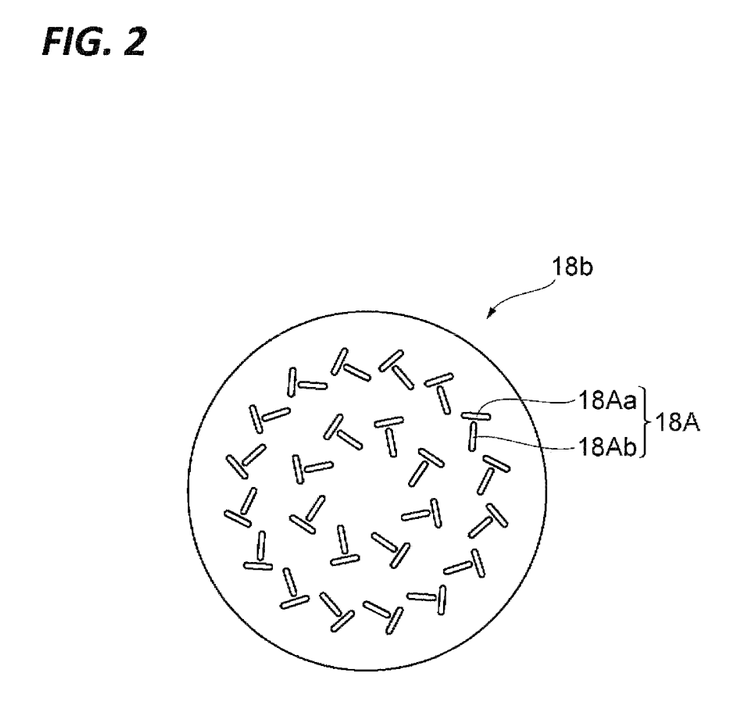
FIG. 2 is a plan view illustrating an exemplary planar antenna illustrated in FIG. 1.

The planar antenna 18b is a substantially disk-shaped metal plate in which a plurality of slots is formed. In an exemplary embodiment, the planar antenna 18b may be a radial line slot antenna. FIG. 2 is a plan view illustrating an exemplary planar antenna illustrated in FIG. 1. A plurality of slot pairs 18A is formed in the planar antenna 18b. The plurality of slot pairs 18A is formed at a predetermined interval in a radial direction and also disposed at a predetermined interval in a circumferential direction. Each of the plurality of slot pairs 18A includes two slot holes 18Aa and 18Ab. The slot hole 18Aa and the slot hole 18Ab extend in intersecting or orthogonal directions. The microwaves generated by the microwave generator 30 are propagated to the planar antenna 18b through the coaxial waveguide 20, radially propagated through the slow wave plate 18a, and introduced into the processing container 12 through the dielectric window member 16 from the slots 18A.

The dielectric window member 16 has substantially a disk shape and is formed of, for example, quartz or alumina. The dielectric window member 16 is provided to face the stage 14 in the axis X direction and immediately below the planar antenna 18b. The dielectric window member 16 transmits the microwaves received from the antenna 18 to introduce the microwaves into the processing space S. Therefore, an electric field is generated immediately below the dielectric window member 16 and plasma is generated in the processing space S. As described above, according to the plasma processing apparatus 10, the plasma may be generated using the microwaves without applying a magnetic field.

A bottom surface of the dielectric window member 16 may define a concave portion 16d. The concave portion 16d is annularly formed around the axis X and has a tapered shape. The concave portion 16d is formed to accelerate the generation of standing waves by the introduced microwaves and may contribute to efficient generation of plasma by the microwaves.

In the plasma processing apparatus 10, the inner conductor 20b may have a tubular shape extending along the axis X. The piping member 24 may be inserted into the inner conductor 20b. A gas supply system 40 is connected to one end of the piping member 24. The gas supply system 40 may be configured by a flow rate controller 40a which is called a mass flow controller and an opening/closing valve 40b. In an exemplary embodiment, a processing gas from the gas supply system 40 is supplied into the injector 22 through the piping member 24. The processing gas from the piping member 24 is supplied into the processing space S through a through hole 16a which is formed in the injector 22 and the dielectric window member 16.

In addition, the plasma processing apparatus 10 may further include a separate gas supply unit 42. The gas supply unit 42 includes a gas pipe 42a. The gas pipe 42a circularly extends around the axis X between the dielectric window member 16 and the stage 14. In the gas pipe 42a, a plurality of gas injecting holes 42b which injects a gas in a direction toward the axis X is formed. The gas supply unit 42 is connected to a gas supply system 44.

The gas supply system 44 includes a gas pipe 44a, an opening/closing valve 44b, and a flow rate controller 44c which is called a mass flow controller. The processing gas is supplied to the gas pipe 42a of the gas supply unit 42 through the flow rate controller 44c, the opening/closing valve 44b, and the gas pipe 44a. Further, the gas pipe 44a penetrates the side wall 12a of the processing container 12. The gas pipe 42a of the gas supply unit 42 may be supported by the side wall 12a through the gas pipe 44a.

The stage 14 is provided to leave the processing space S between the antenna 18 and the stage 14. The substrate to be processed W is placed on the stage 14. In an exemplary embodiment, the stage 14 may include a stand 14a, a focus ring 14b, and an electrostatic chuck 14c.

The stand 14a is supported by a tubular support 46. The tubular support 46 is formed of an insulating material and extends upwardly from the bottom portion 12b in a vertical direction. Further, a conductive tubular support 48 is provided at an outer periphery of the tubular support 46. The tubular support 48 extends upwardly from the bottom portion 12b of the processing container 12 in the vertical direction along the outer periphery of the tubular support 46. A circular exhaust passage 50 is formed between the tubular support 46 and the side wall 12a.

A circular baffle plate 52 which has a plurality of through holes formed therein is attached to an upper portion of the exhaust passage 50. In the case of a film forming device, the baffle plate may not be provided. An exhausting device 56 is connected to a lower portion of the exhaust hole 12h through an exhaust tube 54. The exhausting device 56 includes a vacuum pump such as a turbo molecular pump. A pressure of the processing space S within the processing container 12 may be uniformly reduced to be a desired degree of vacuum by the exhausting device 56.

The stand 14a also serves as a high frequency electrode. An RF bias high frequency power supply 58 is electrically connected to the stand 14a through a matching unit 60 and a power feeding rod 62. The high frequency power supply 58 outputs a high frequency power of a predetermined frequency which is suitable for controlling an energy of ions to be attracted to the substrate to be processed W, for example, 13.65 MHz with a predetermined power. The frequency may range from 400 kHz to 60 MHz. The matching unit 60 accommodates a matching device which matches impedance at the high frequency power supply 58 side with impedance at a load side, mainly such as an electrode, plasma, and the processing container 12. A self-bias generating blocking capacitor is included in the matching device.

The electrostatic chuck 14c is provided on a top surface of the stand 14a. The electrostatic chuck 14c maintains the substrate to be processed W by an electrostatic attraction force. The focus ring 14b which circularly encloses the periphery of the substrate to be processed W is provided at an outside of the electrostatic chuck 14c in a radial direction. The electrostatic chuck 14c includes an electrode 14d, an insulating film 14e, and an insulating film 14f. The electrode 14d is configured by a conductive film and provided between the insulating film 14e and the insulating film 14f. A high voltage DC power supply 64 is electrically connected to the electrode 14d through a switch 66 and a coated wire 68. The electrostatic chuck 14c may attract and maintain the substrate to be processed W by a coulomb force which is generated by a DC voltage applied from the DC power supply 64.

A circular coolant chamber 14g extending circumferentially is provided within the stand 14a. A coolant at a predetermined temperature, for example, cooling water, which is provided from a chiller unit (not illustrated) through pipes 70 and 72 is circularly supplied in the coolant chamber 14g. A heat transfer gas of the electrostatic chuck 14c, for example, a He gas is supplied to a gap between the top surface of the electrostatic chuck 14c and a rear surface of the substrate to be processed W through a gas supplying pipe 74 by a temperature of the coolant.

Figure 3:
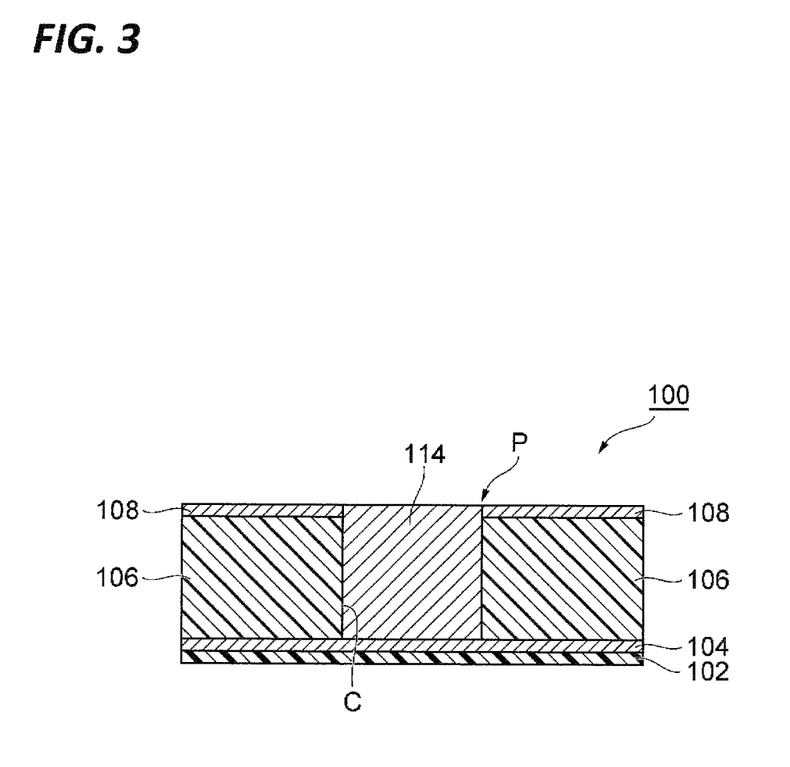
FIG. 3 is a view illustrating a cross-sectional configuration of a semiconductor device.

Next, a semiconductor device which is manufactured using the plasma processing apparatus 10 will be described. FIG. 3 is a view illustrating a cross-sectional configuration of a semiconductor device according to an exemplary embodiment. As illustrated in FIG. 3, a wiring pattern P is formed in the semiconductor device 100 by a damascene process technology (a damascene method). The wiring pattern P of the semiconductor device 100 is formed such that Cu (copper) 114 which is a wiring member is directly buried in a CF film (a fluorinated carbon film: k=2.1) 106 which is an insulation film. The CF film 106 is formed on a $SiO_2$ film 102 formed on a surface of a semiconductor substrate (a substrate to be processed W) (not illustrated) through another insulating film 104. In FIG. 3, the Cu 114 extends along a depth direction. Further, in the example illustrated in FIG. 3, even though only one Cu 114 is disposed, in an actual semiconductor device 100, a plurality of Cus 114 is disposed at a predetermined interval (for example, approximately 200 nm).

Figure 4:
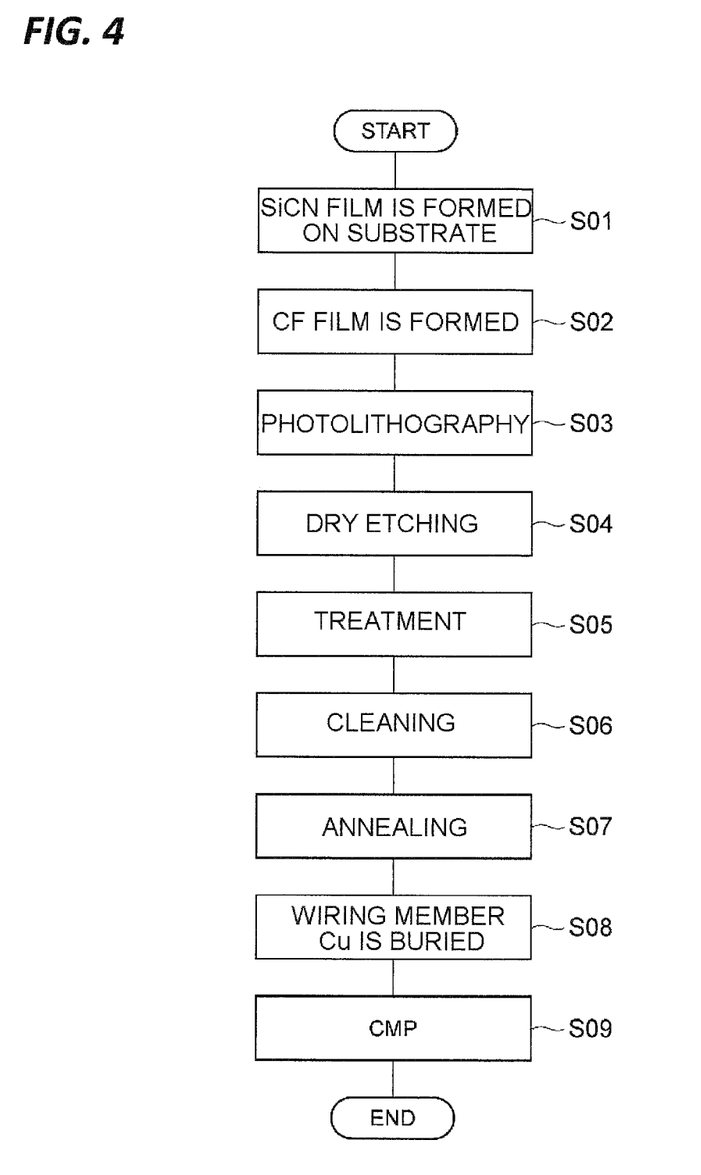
FIG. 4 is a flowchart illustrating a semiconductor device manufacturing process.

Subsequently, a method of manufacturing the semiconductor device 100 will be described. FIG. 4 is a flowchart illustrating a semiconductor device manufacturing process. FIGS. 5(a)-5(f) are views illustrating the semiconductor device manufacturing process.

Figure 5:
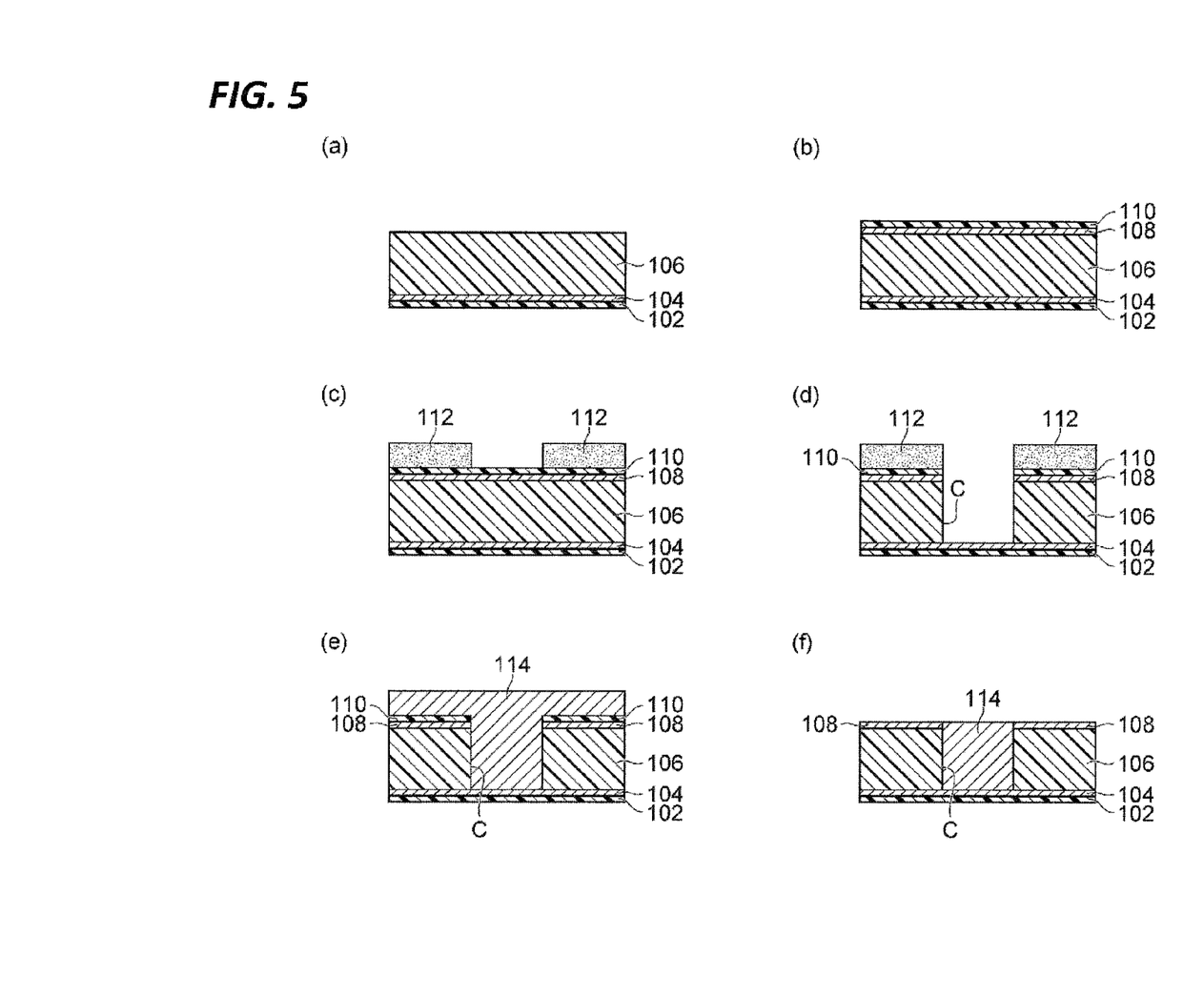
FIGS. 5(a)-5(f) are views illustrating the semiconductor device manufacturing process.

As illustrated in FIG. 4, first, a SiCN film 104 is formed on an $SiO_2$ semiconductor substrate 102 by the plasma processing apparatus 10 in step S01 of FIG. 5(a). A thickness of the SiCN film 104 is, for example, approximately 50 nm. The SiCN film 104 is formed by supplying trimethylsilane gas and Ar gas into the processing space S by the gas supply unit 42 and the gas supply system 40 and generating plasma containing active species of silicon, carbon, and hydrogen, performing a processing which does not supply the nitrogen gas for approximately five seconds, and then supplying the nitrogen gas into the processing space S to generate an active species of nitrogen.

Next, a CF film 106 which is an insulating film is formed on the SiCN film 104 by the plasma processing apparatus 10 in step S02 of FIG. 5(a). The CF film 106 is formed by activating $C_5F_8$ gas supplied into the processing space S of the plasma processing apparatus 10 so as to generate plasma and form an active species, and depositing the active species on a surface of the semiconductor substrate 102. The CF film 106 is formed by the plasma processing apparatus 10 so that a film formation space in which an active species is present is formed below the plasma processing space at the upper portion and the CF film 106 is formed by a so-called soft active species. Therefore, a CF film 106 which is dense and has high adhesion with Cu and high thermal stability may be obtained. A thickness of the CF film 106 is, for example, approximately 500 nm.

Subsequently, a SiCN film 108 is formed on the CF film 106 (FIG. 5(b)). The SiCN film 108 is formed by the same method as described above. A thickness of the SiCN film 108 is, for example, approximately 50 nm. Further, the SiCN film 108 may have a laminated structure of a SiC film and a SiCN film.

Subsequently, a $SiO_2$ film 110 is formed on the SiCN film 108. A thickness of the $SiO_2$ film 110 is, for example, approximately 50 nm. Monosilane gas and oxygen gas are generated as plasma and the $SiO_2$ film 110 is formed by the plasma. A photoresist 112 is formed on the $SiO_2$ film 110 and is exposed by, for example, a stepper of a KrF eximer laser to perform photolithography in step S03. Thereafter, dry etching is performed using $CF_4$ gas in step S04 and thus as illustrated in FIG. 5(d), a groove C corresponding to a wiring pattern P is formed on the CF film 106.

Subsequently, a plasma processing (nitride plasma processing) is performed on the CF film 106 formed with the groove C using $N_2$ gas using the plasma apparatus 1 of the present exemplary embodiment in step S05. In this case, a condition of the plasma processing is that a power of a microwave is 2500 W, an output RF power of the high frequency power supply 58 is 10 W, and a processing time is four seconds. Further, a processing time of the plasma processing may be appropriately set in a range of 4 to 60 seconds. A fluorine content on the front surface (a front surface which defines the groove C) of the CF film 106 is changed by the plasma processing, that is, the fluorine content is reduced as fluorine is removed, and the front surface of the CF film 106 is modified. A carbon-rich layer is formed on the surface of the CF film 106. Further, in order to remove an etching residue or an oxide film-based hard mask in the groove C, cleaning is performed using dilute hydro fluoride (DHF) in step S06. Then, in order to remove moisture, an annealing processing is performed at a temperature of the processing space S of 350° C. for two hours in step S07. In the process of step S07, annealing may be performed using an annealing device of a different chamber.

Subsequently, Cu which is a wiring material (metal) is deposited in the groove C by sputtering and additionally formed by an electrolyte metal plating method. Then, Cu 114 is filled in the groove C of the CF film 106 to be buried in step S08 of FIG. 5(e). Further, the Cu may be filled using any one or at least two of a sputtering method, an electrolyte metal plating method, an electroless plating method, and a CVD method. Thereafter, Cu other than Cu buried in the groove C is removed by a chemical mechanical polishing (CMP) method to planarize a surface in step S09 of FIG. 5(f). Finally, a surface protective film (not illustrated), for example, an oxide film or a nitride film is formed.

Further, in the above-described method, when the plasma processing is performed on the surface of the CF film 106, $N_2$ gas is used to perform the nitride plasma processing. However, $SiH_4$ (silane) gas or hydrogen plasma may be used for the plasma processing. As for a gas used for the plasma processing, a gas which reduces fluorine (F) on the front surface of the CF film 106 may be used.

Further, as for a gas which generates plasma, in the above-described example, Ar gas is used, but other rare gas, for example, He (helium) gas, Ne (neon) gas, Kr (krypton) gas, or Xe (xenon) gas may be used. A raw gas of the CF film 106 is not limited to the $C_5F_8$ gas, but $CF_4$ gas, $C_2F_6$ gas, $C_3F_8$ gas, $C_3F_6$ gas, and $C_4F_8$ gas may be used. Further, a gas used for obtaining an active species of nitrogen when the SiCN film 108 is formed is not limited to the nitrogen gas, but ammonia gas may be used.

Further, an organic compound of silicon which is used to form the SiCN film 108 is not limited to the trimethylsilane gas, but may be other organic compounds. A specific example thereof may include $CH_3SiH_3$, $(CH_3)_2SiH_2$, $(CH_3)_3SiH$, $(CH_3)_4Si$, $(CH_3)_2Si(OC_2H_5)_2$, $(CH_3)_2Si(OCH_3)_2$, $CH_3Si(OC_2H_5)_3$, $CH_3Si(OCH_3)_3$, $(HCH_3SiO)_4$ [cyclic structure], $((CH_3)_3Si)_2O$, $(H(CH_3)_2Si)_2O$, $(H_2CH_3Si)_2O$, $((CH_3)_2SiO)_3$, $(CH_3ASiO)_3$, $((CH_3)_2SiO)_4$, and $(CH_3ASiO)_4$. Further, last three compounds have cyclic structures and "A" stands for a vinyl group (CH—$CH_3$).

As described above, in the present exemplary embodiment, a CF film 106 is adopted as an insulating film and a groove C is formed by performing dry etching on the CF film 106, and then a nitride plasma processing is performed before burying the Cu 114 in the groove C. As described above, the nitride plasma processing is performed on the CF film 106 so that fluorine F on the front surface of the CF film 106 is removed to form a carbon-rich layer and the front surface of the CF film 106 is modified. Therefore, a wetting property of the front surface of the CF film 106 is improved and the CF film 106 and the Cu 114 are bonded to be in contact with each other, and the adhesion between the CF film 106 and the Cu 114 may be improved.

Figure 6:
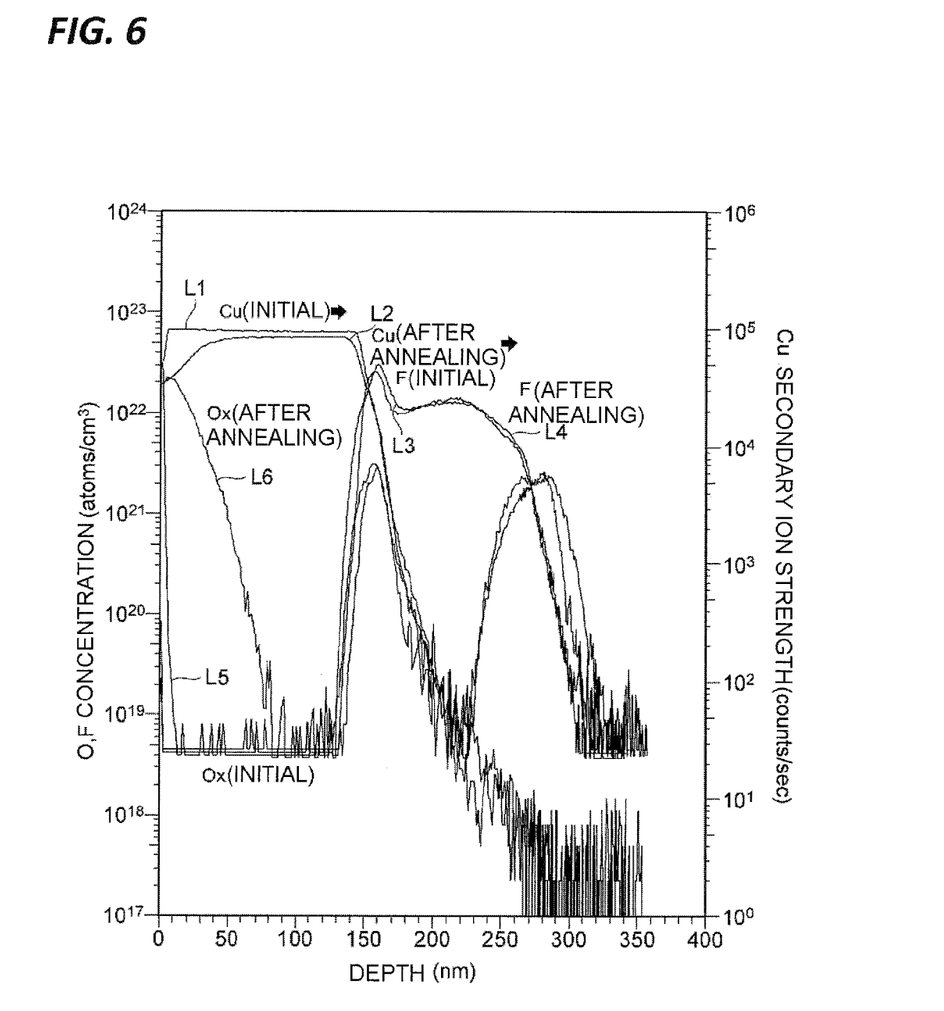
FIG. 6 is a graph illustrating an analysis result of SIMS.

FIG. 6 is a graph illustrating an analysis result of secondary ion mass spectrometry (SIMS). In FIG. 6, a horizontal axis represents a depth (nm) and a vertical axis indicates a concentration (atoms/$cm^3$), and a secondary ion strength (counts/sec). The analysis of the SIMS illustrated in FIG. 6 is performed on a sample in which the oxide film, the CF film, and Cu are laminated on the Si substrate in this order and the nitride plasma processing is performed on the CF film for 30 seconds. In FIG. 6, Cu in an initial state is represented by line L1, Cu after annealing is represented by line L2, F (fluorine) in an initial state is represented by line L3, F after annealing is represented by line L4, an oxide film Ox in the initial state is represented by line L5, and the oxide film after annealing is represented by line L6.

As illustrated in FIG. 6, it was found that Cu in the initial state and Cu after annealing show the same characteristic and thermal diffusion of Cu into the CF film (a film in which C is rich on the surface) hardly occurs. Likewise, it was further found that diffusion of F into Cu does not occur. As described above, in the semiconductor device 100, the insulating film is formed as a CF film 106 in which C is rich on the surface so that the diffusion of the Cu 114 into the CF film 106 is suppressed and thus time dependent dielectric breakdown (TDDB) may be suppressed from occurring. As a result, reliability of the semiconductor device 100 may be improved.

Figure 7:
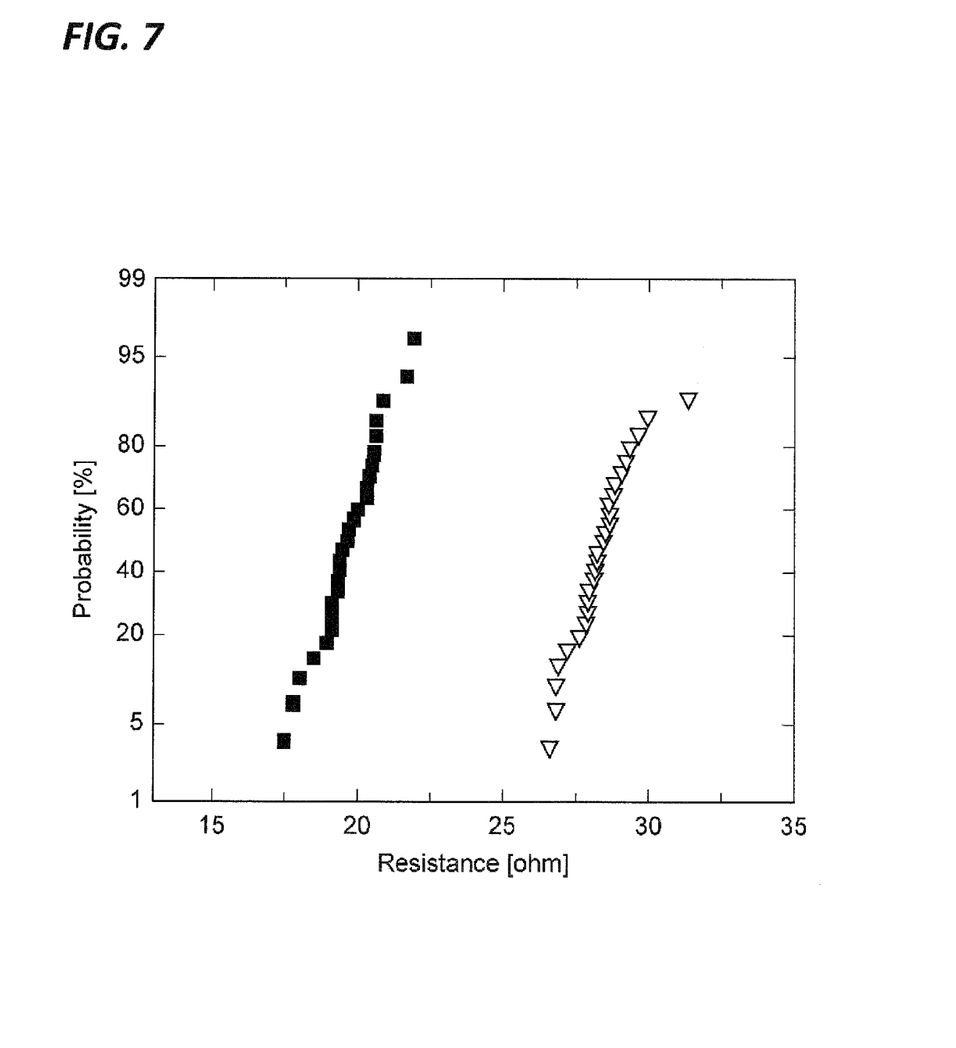
FIG. 7 is a graph illustrating a characteristic of a resistance.
Figure 8:
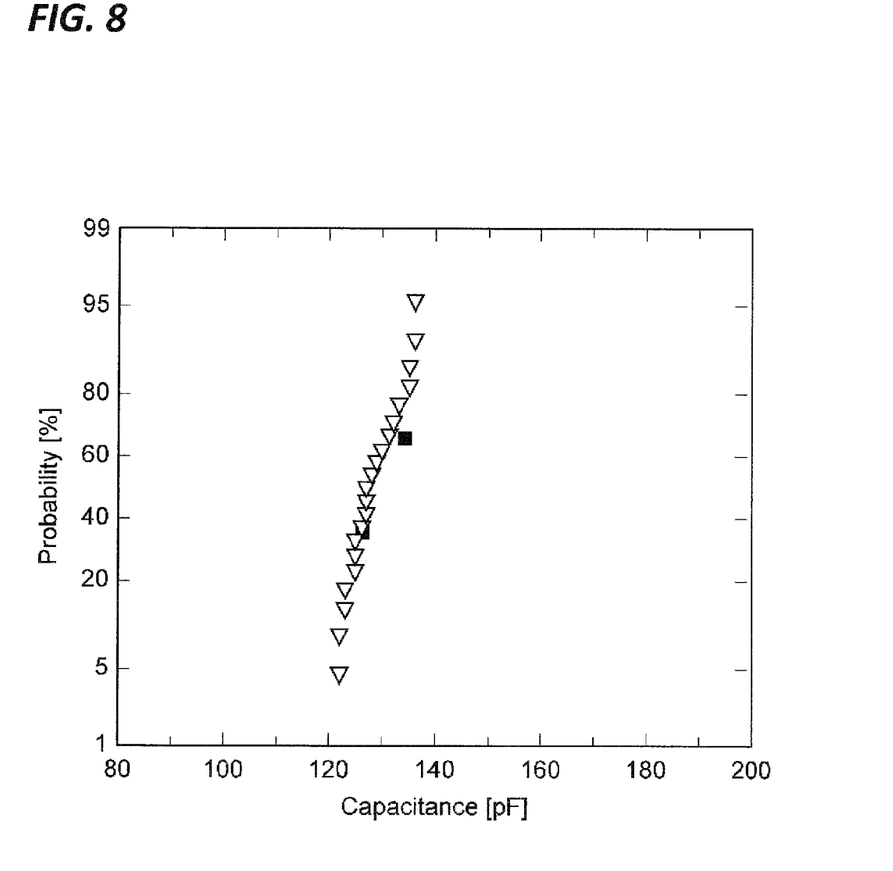
FIG. 8 is a graph illustrating a characteristic of an electrostatic capacitance.

FIG. 7 is a graph illustrating a characteristic of a resistance. In FIG. 7, a horizontal axis represents a resistance (ohm) and a vertical axis represents a probability distribution (%). Further, in FIG. 7, a characteristic of the semiconductor device 100 according to the present exemplary embodiment is represented by "■" and a characteristic of a conventional semiconductor device in which a barrier metal layer (Ti/TiN/Ti) is provided is represented by "▽". FIG. 8 is a graph illustrating a characteristic of an electrostatic capacitance. In FIG. 8, a horizontal axis represents an electrostatic capacitance (inter-line capacitance) (pF) and a vertical axis represents a probability distribution (%). Further, in FIG. 8, a characteristic of the semiconductor device 100 according to the present exemplary embodiment is represented by "■" and a characteristic of the conventional semiconductor device in which a barrier metal layer is provided is represented by "▽".

As illustrated in FIG. 7, when a probability distribution is, for example, 50%, as compared with the conventional semiconductor device which includes a barrier metal layer, the resistance of the semiconductor device 100 is lowered by approximately 25%. Further, the semiconductor device 100 may obtain the same characteristic as the conventional semiconductor device which includes a barrier metal layer, with respect to the electrostatic capacitance. Accordingly, the semiconductor device 100 may improve wiring delay caused by the wiring resistance and the electrostatic capacitance.

The present disclosure is not limited to the above-described exemplary embodiment. For example, in the above exemplary embodiment, an example in which a wiring pattern P is provided on the semiconductor substrate has been described, but in the case of a multilayer wiring structure, for example, an upper layer wiring pattern P may be formed on a lower layer wiring pattern on which an interlayer insulating film (CF film) and the wiring line (Cu) are formed. In this case, a Cu 114 of the wiring pattern P is electrically connected to a lower layer wiring line (Cu) by a via hole.

Figure 9:
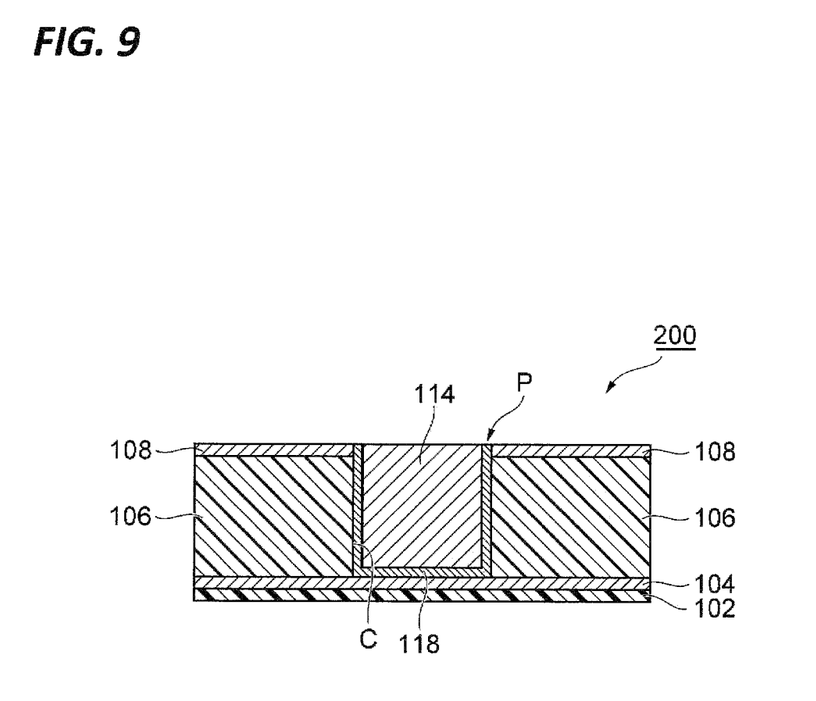
FIG. 9 is a view illustrating a cross-sectional configuration of a semiconductor device according to another exemplary embodiment.

Further, in addition to the exemplary embodiment, a very thin oxide film or carbon film may be provided between the CF film 106 and the Cu 114. FIG. 9 is a view illustrating a cross-sectional configuration of a semiconductor device according to another exemplary embodiment. As illustrated in FIG. 9, in a semiconductor device 200, an oxide film 118 is provided between a CF film 106 and a Cu 114. The oxide film 118 is for example, an a-CSiO film (amorphous carbon silicon oxide film). A thickness of the oxide film 118 preferably ranges from 1 nm to 15 nm or less and more preferably from 3 nm to 10 nm, in terms of a barrier property and low resistance of Cu. As described above, the oxide film 118 is provided between the CF film 106 and the Cu 114, and is very thin, which may result in a low resistance and a reduction of a wiring resistance and further suppress diffusion of the Cu 114 into the CF film 106. The oxide film 118 is formed, for example, by plasma of organic silane-based compound gas such as trimethylsilane (TMS) and oxygen gas, and an oxygen-containing gas such as $NO_2$. Further, the carbon film is generated by plasma of a hydrocarbon compound gas such as 2-butene.

Figure 10:
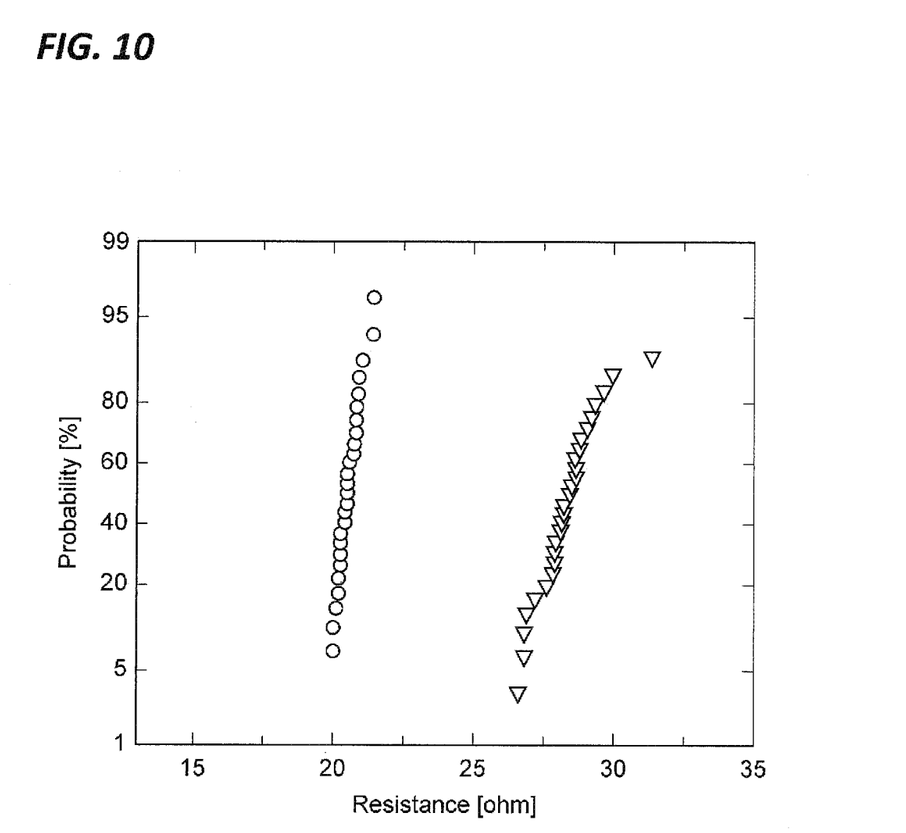
FIG. 10 is a graph illustrating a characteristic of a resistance of a semiconductor device illustrated in FIG. 9, in which an oxide film is provided between a CF film and Cu.

FIG. 10 is a graph illustrating a characteristic of a resistance in the semiconductor device illustrated in FIG. 9 in which the oxide film 118 is provided between the CF film 106 and the Cu 114. In FIG. 10, a horizontal axis represents a resistance (ohm) and a vertical axis represents a probability distribution (%). Further, in FIG. 10, a characteristic of the semiconductor device 200 in which the oxide film 118 is provided between the CF film 106 and the Cu 114 is represented by "O" and a characteristic of a conventional semiconductor device in which a barrier metal layer is provided is represented by "∇". As illustrated in FIG. 10, when the probability distribution is 50%, a resistance of the semiconductor device 200 in which the oxide film 118 is provided between the CF film 106 and the Cu 114 is lowered by about 25% as compared with the semiconductor device including the barrier metal layer. Therefore, in the semiconductor device 200, the wiring delay may be reduced.

Further, in the semiconductor device 200 illustrated in FIG. 9, the nitride plasma processing may be performed before forming the oxide film 118 or the nitride plasma processing may not be performed.

Further, in the exemplary embodiment (the semiconductor device 100 illustrated in FIG. 3), before burying the Cu 114 into the groove C of the CF film 106, the nitride plasma processing is performed, but the nitride plasma processing may not be performed. Even in the case of the configuration as described above, the CF film 106 itself has a barrier function so that diffusion of the Cu 114 into the CF film 106 may be suppressed.

Figure 11:
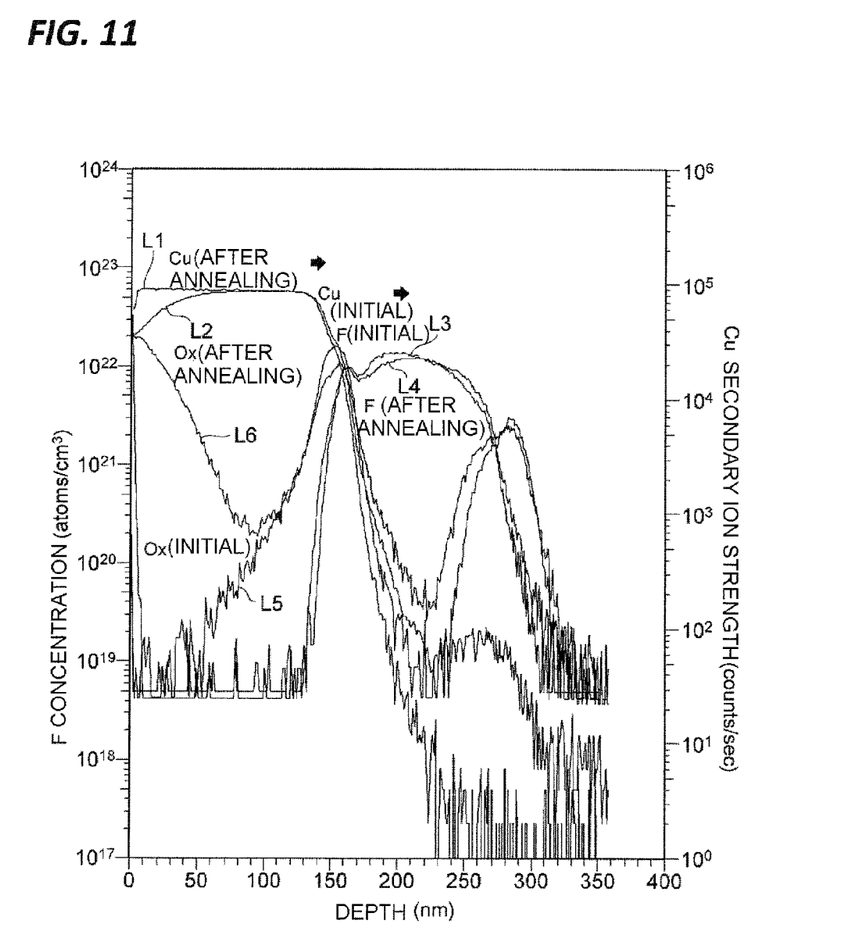
FIG. 11 is a graph illustrating an analysis result of SIMS of a semiconductor device according to another exemplary embodiment.

FIG. 11 is a graph illustrating an analysis result of SIMS of a semiconductor device according to another exemplary embodiment. Similarly to FIG. 6, The SIMS analysis illustrated in FIG. 11 is performed on a sample in which an oxide film, a CF film and Cu are laminated on a Si substrate in this order. In FIG. 11, Cu in an initial state is represented by line L1, Cu after annealing is represented by line L2, F (fluorine) in an initial state is represented by line L3, F after annealing is represented by line L4, an oxide film Ox in the initial state is represented by line L5, and the oxide film after annealing is represented by line L6.

As illustrated in FIG. 11, even when the nitride plasma processing is not performed on the CF film, that is, Cu is directly buried in the CF film, thermal diffusion of Cu is hardly observed. Accordingly, even when the nitride plasma processing is not performed on the CF film 106, occurrence of TDDB may be suppressed, thereby improving the reliability.

REFERENCE SIGNS LIST

10: Plasma processing apparatus
12: Processing container
30: Microwave generator
18: Antenna
40: Gas supply system (Gas supply unit)
42: Gas supply unit (Material gas supply unit)
100: Semiconductor device
104: Semiconductor substrate
106: CF film (Insulating film)
114: Cu (Wiring member)
C: Groove
P: Wiring pattern (Wiring line)

The invention claimed is:

1. A semiconductor device comprising:
   an insulating film formed with a fluorinated carbon film and having a groove; and
   a wiring member formed of copper which is buried in the groove of the insulating film to form a wiring line of a damascene structure,
   wherein at least a portion of a front surface of the insulating film that contacts the wiring member includes a carbon-rich layer in which a carbon content is higher than a fluorine content.

2. The semiconductor device of 1, wherein the fluorine content of the front surface of the insulating film after a plasma treatment differs from that of the front surface of the insulating film not treated with plasma.

3. The semiconductor device of claim 2, wherein the front surface of the insulating film includes nitrogen as an active species after the plasma treatment.

* * * * *